United States Patent
Chen et al.

(10) Patent No.: US 7,928,549 B2
(45) Date of Patent: Apr. 19, 2011

(54) INTEGRATED CIRCUIT DEVICES WITH MULTI-DIMENSIONAL PAD STRUCTURES

(75) Inventors: Hai-Ching Chen, Hsinchu (TW); Harold C. H. Hsiung, Taipei (TW); Henry Lo, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 29 days.

(21) Appl. No.: 11/522,985

(22) Filed: Sep. 19, 2006

(65) Prior Publication Data

US 2008/0067657 A1  Mar. 20, 2008

(51) Int. Cl.
*H01L 23/485* (2006.01)
*H01L 23/02* (2006.01)
*H01L 23/48* (2006.01)
*H01L 23/52* (2006.01)
*H01L 29/40* (2006.01)

(52) U.S. Cl. . 257/686; 257/777; 257/786; 257/E25.013; 257/E21.614

(58) Field of Classification Search .................. 257/703, 257/698, 666–670, 777, 778, E23.015, E23.02, 257/E21.59, 686, 786, E21.614, E25.013; 174/261

See application file for complete search history.

(56) References Cited

U.S. PATENT DOCUMENTS

| | | | | |
|---|---|---|---|---|
| 3,370,203 A * | 2/1968 | Kravitz et al. | ............... | 361/730 |
| 5,016,138 A * | 5/1991 | Woodman | ............... | 361/688 |
| 5,068,714 A * | 11/1991 | Seipler | ............... | 257/703 |
| 5,107,586 A * | 4/1992 | Eichelberger et al. | ........... | 29/830 |
| 5,266,833 A * | 11/1993 | Capps | ............... | 257/690 |
| 5,281,852 A * | 1/1994 | Normington | ............... | 257/685 |
| 5,313,096 A * | 5/1994 | Eide | ............... | 257/686 |
| 5,424,920 A * | 6/1995 | Miyake | ............... | 361/735 |
| 5,517,057 A * | 5/1996 | Beilstein et al. | ............... | 257/686 |
| 5,561,622 A * | 10/1996 | Bertin et al. | ............... | 365/51 |
| 5,737,192 A * | 4/1998 | Linderman | ............... | 361/790 |
| 5,807,791 A * | 9/1998 | Bertin et al. | ............... | 438/738 |
| 5,818,107 A * | 10/1998 | Pierson et al. | ............... | 257/723 |
| 5,834,162 A * | 11/1998 | Malba | ............... | 430/317 |
| 5,925,924 A * | 7/1999 | Cronin et al. | ............... | 257/622 |
| 6,034,438 A * | 3/2000 | Petersen | ............... | 257/786 |
| 6,188,129 B1 * | 2/2001 | Paik et al. | ............... | 257/686 |
| 6,229,099 B1 * | 5/2001 | Horiuchi et al. | ............... | 174/261 |
| 6,563,205 B1 * | 5/2003 | Fogal et al. | ............... | 257/686 |
| 6,563,224 B2 * | 5/2003 | Leedy | ............... | 257/778 |
| 6,593,645 B2 * | 7/2003 | Shih et al. | ............... | 257/686 |
| 6,661,085 B2 * | 12/2003 | Kellar et al. | ............... | 257/686 |
| 6,686,654 B2 * | 2/2004 | Farrar et al. | ............... | 257/686 |
| 7,067,910 B2 * | 6/2006 | Drost et al. | ............... | 257/686 |
| 7,115,984 B2 * | 10/2006 | Poo et al. | ............... | 257/698 |
| 7,633,159 B2 * | 12/2009 | Boon et al. | ............... | 257/730 |
| 7,679,179 B2 * | 3/2010 | Jeung et al. | ............... | 257/690 |
| 2003/0057544 A1 * | 3/2003 | Nathan et al. | ............... | 257/700 |
| 2004/0021230 A1 * | 2/2004 | Tsai et al. | ............... | 257/777 |
| 2005/0184377 A1 * | 8/2005 | Takeuchi et al. | ............... | 257/686 |
| 2005/0184400 A1 * | 8/2005 | Kobrinsky et al. | ............... | 257/777 |
| 2005/0224921 A1 * | 10/2005 | Gupta et al. | ............... | 257/621 |
| 2006/0017147 A1 * | 1/2006 | Drost et al. | ............... | 257/686 |
| 2006/0043563 A1 * | 3/2006 | Gann et al. | ............... | 257/686 |
| 2008/0006921 A1 * | 1/2008 | Park et al. | ............... | 257/686 |

* cited by examiner

*Primary Examiner* — Teresa M Arroyo

(74) *Attorney, Agent, or Firm* — Birch, Stewart, Kolasch & Birch, LLP

(57) ABSTRACT

Integrated circuits with multi-dimensional pad structures are provided. An exemplary embodiment of an integrated circuit device with multi-dimensional pad structures comprises an integrated circuit (IC) stack structure comprising a plurality of device layers, wherein one of the devices comprise a first pad exposed by an edge surface thereof.

12 Claims, 15 Drawing Sheets

US 7,928,549 B2

INTEGRATED CIRCUIT DEVICES WITH MULTI-DIMENSIONAL PAD STRUCTURES

BACKGROUND OF THE INVENTION

1. Field of the Invention

The present invention relates to integrated circuit fabrication, and in particular to integrated circuit (IC) devices with multi-dimensional pad structures.

2. Description of the Related Art

As reduction of the critical dimensions VLSI circuits continues, system performance of Integrated Circuits (ICs) will be increasingly dominated by interconnect performance. For technology generations approaching 100 nm, innovative circuit designs and new interconnect materials and architecture will be required to meet the projected system performance. New interconnect material solutions such as copper and low-k dielectric offer only a limited system improvement. Significant and scalable solutions to interconnect delay problems will require fundamental changes in system architecture, and fabrication technologies.

Recently, three dimensional (3D) ICs allowing devices to exist on more than one device layer have been developed. Devices formed in a 3D IC can be contacted from both top and bottom device layers. The flexibility to place devices along the third dimension allows higher device density and smaller chip area in the 3D IC. The critical interconnect paths that limit system performance can also be shortened by 3D integration to achieve faster clock speed. By such 3D integration, active layers fabricated with different front-end processes can be stacked to form a system on a chip.

FIG. 1 illustrates a three dimensional (3D) structure memory device 100 disclosed in U.S. Pat. Appl. Pub. No. US 2004/0070063 by Leedy. The 3D memory device 100 includes some number of memory array circuits 103 stacked over a controller circuit 101. Interconnect layer 105 defines a vertical interconnect contact area between the integrated circuits. I/O bond pad are formed on a final memory circuit layer for use with conventional package methods.

Since I/O bond pads illustrated in U.S. Pat. Appl. Pub. No. US 2004/0070063 are formed only on a final memory circuit layer, the number of pins available for connecting the I/O bond pads with a final package substrate is thereby limited, as well as performance of the 3D IC device.

BRIEF SUMMARY OF THE INVENTION

Integrated circuits with multi-dimensional pad structures are provided. An exemplary embodiment of an integrated circuit device with multi-dimensional pad structures comprises an integrated circuit (IC) stack structure comprising a plurality of device layers, wherein one of the devices comprises a first pad exposed by an edge surface thereof.

Another embodiment of an integrated circuit device with multi-dimensional pad structures comprises a first device layer comprising a first pad exposed by an edge surface thereof. A second device layer comprising a second pad exposed by an edge surface thereof is formed over the first device layer, wherein the second pad substantially overlies the first pad to form a composite pad.

An exemplary embodiment of an integrated circuit package comprises a package substrate, an integrated circuit (IC) stack structure and a first conductive bonding provides electrically connection therebetween. The integrated circuit (IC) stack comprises a plurality of device layers, wherein one of the device layers comprises a first pad exposed by an edge surface thereof and the first conductive bonding electrically connects the first pad with the package substrate.

Another embodiment of an integrated circuit package comprises a package substrate, an integrated circuit (IC) stack structure partially embedded in the package substrate, and a first conductive bonding electrically connects the package substrate and the integrated circuit (IC) stack structure. The integrated circuit (IC) stack structure comprises a plurality of device layers, wherein one of the devices comprises a first pad exposed by an edge surface thereof and is electrically connected with the package substrate by the first conductive bonding.

Yet another embodiment of an integrated circuit package comprises a package substrate with a bond pad formed thereon, an integrated circuit (IC) stack structure embedded in the package substrate, and a conductive bonding formed on the package substrate, electrically connecting the integrated circuit (IC) stack structure with the bond pad formed on the package substrate. The integrated circuit (IC) stack structure comprises a plurality of device layers, wherein one of the devices comprises a first pad exposed by a topmost surface thereof and is electrically connected to the bond pad by the conductive bonding.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

An integrated circuit device with multi-dimensional pad structures will be described in detail in the following. Some embodiments of the invention, such as the exemplary embodiments described, can potentially enhance efficiencies and performances of a 3D IC. In some embodiments, this can be accomplished by forming additional pad structures on edges of the 3D IC.

In this specification, expressions such as "overlying the device layer", "underlying the layer", or "on the device layer" simply denote a relative positional relationship in a film stack including a plurality of device layers. Accordingly, these expressions may indicate not only the direct contact of layers, but also, a non-contact state of one or more laminated layers. Use of the term "device layer" or "active layer" herein describes a layer of dielectric or semiconductor materials including semiconductor devices and/or interconnecting structures therein. Preferably, the semiconductor devices may comprise active device such as transistors or passive device such as capacitors, inductances, or resistors.

Figure 1:
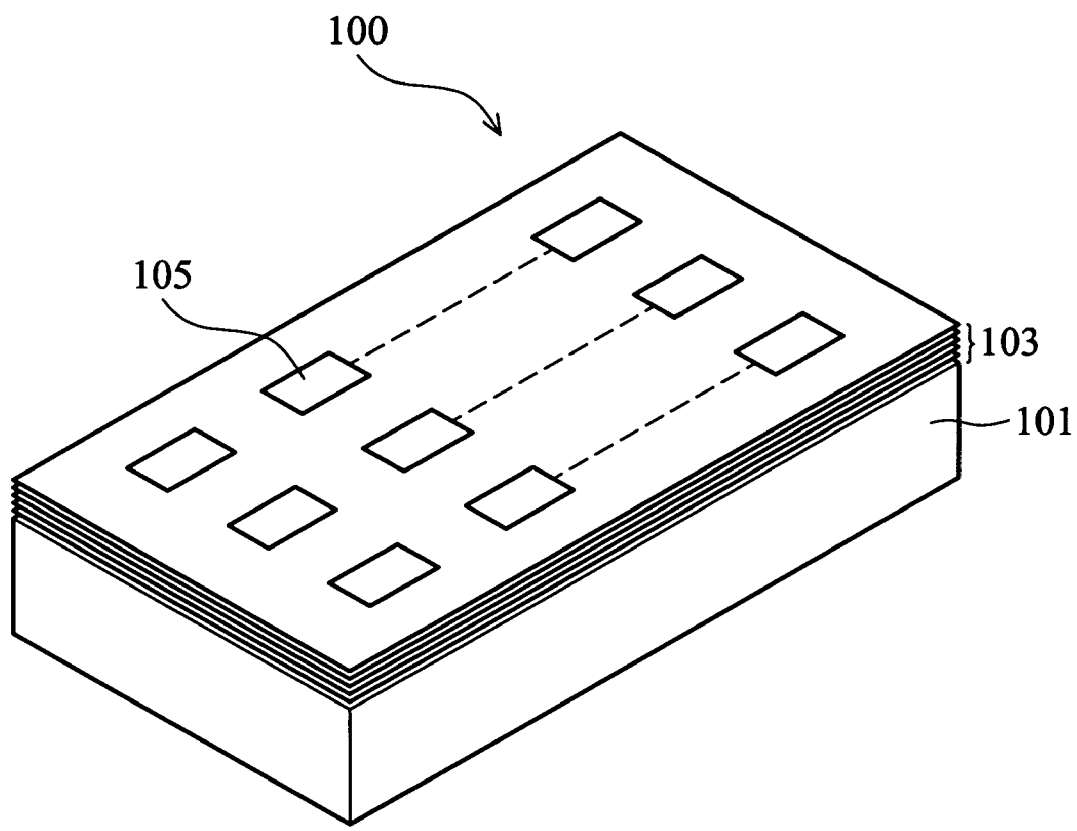
FIG. 1 is a schematic diagram showing a three dimensional (3D) structure memory device in the related art.
Figure 2A:
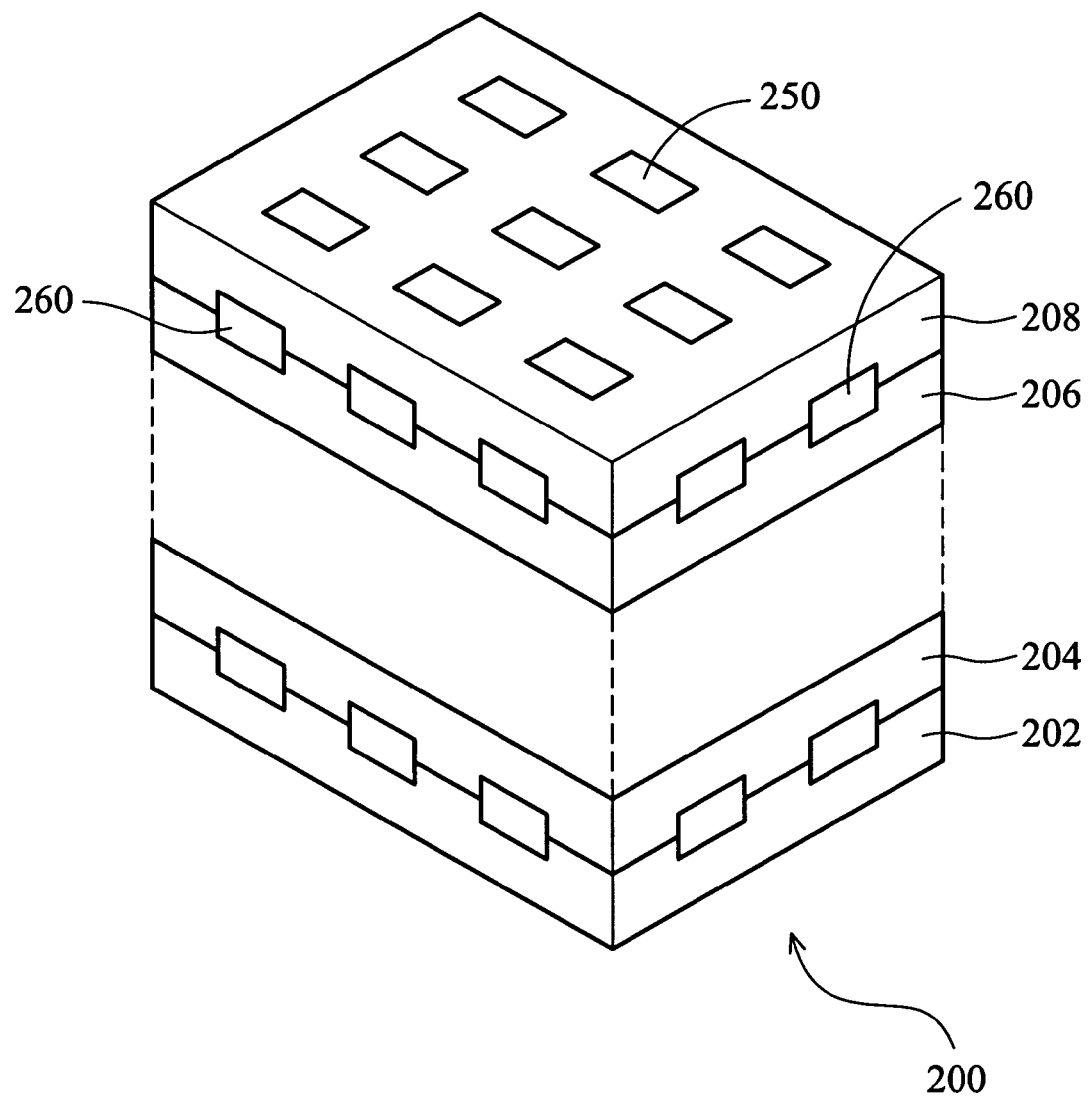
FIGS. 2a-2c are schematic diagrams showing various embodiments of a three dimensional (3D) integrated circuit device with multi-dimensional pad structures.

Referring now to FIG. 2a, an IC device 200 is illustrated. The IC device 200 is formed in the manner of a film stack including a plurality of device layers. Device layers 202, 204, 206 and 208 are shown here for illustration and additional device layers can be further disposed between the device layers 204 and 206 but are not shown here, for simplicity. Each of the device layers may comprise dielectric and/or semiconductor materials, including semiconductor devices and/or interconnecting structures therein. The semiconductor devices formed in each of the device layers may comprise active device such as transistors, passive devices such as capacitors, inductances, or resistors, or combinations thereof to thereby functioning as a controller circuit layer or a memory array layer, for example. Functionality of the devices formed in each of the device layers may work in an individual device layer and preferably work together to thereby provide the IC device 200 with multiple functionalities.

Figure 2B:
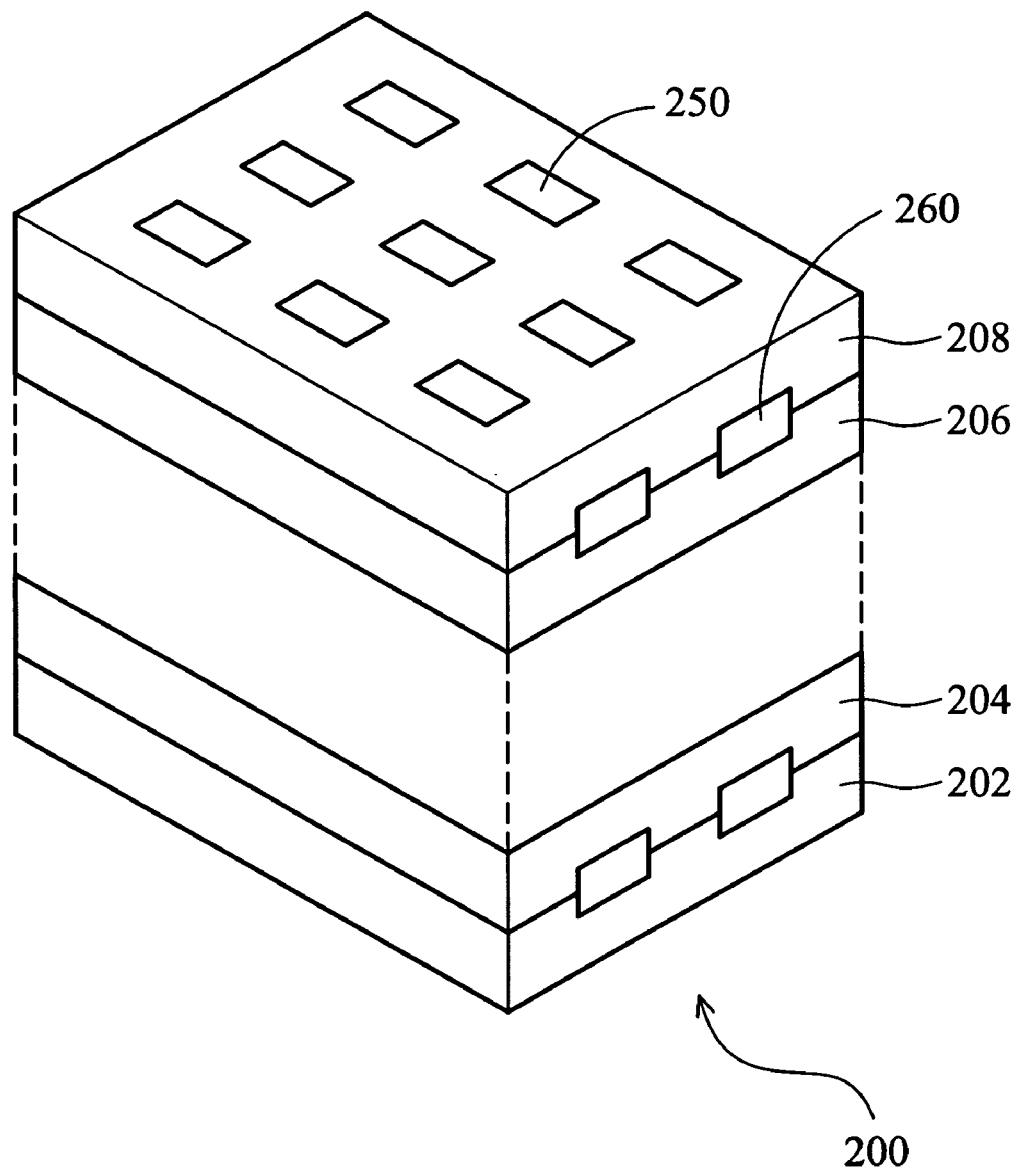
Figure 2C:
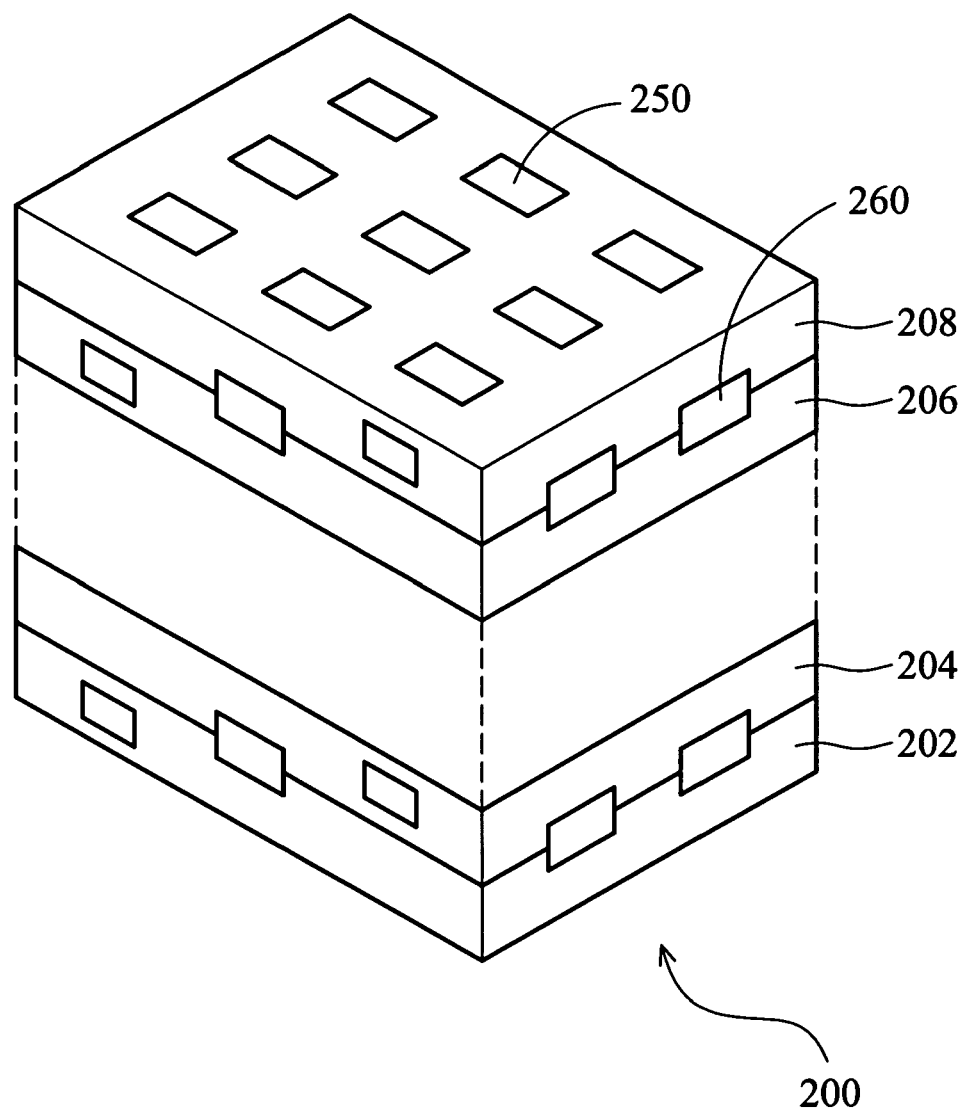

As shown in FIGS. 2a and 2b, a plurality of pads 250 are formed in a topmost device layer 208 of the IC device 200 and the pads 250 are exposed by a top surface thereof for functioning as, for example, I/O bond pads, the same as that the pads formed in the IC structure of the related art. Moreover, a plurality of pads 260 are further provided in one or some of the internal devices layers and may locate on at least one edge surface of the IC device 200. The pads 260 can be formed in one or more internal device layers and are exposed by more than one edge surface of the IC device 200, as shown in FIG. 2a, but is not limited thereto. The pads 260 can only be formed on one edge surface of the IC device 200, as shown in FIG. 2B. The pads 260 in FIGS. 2a and 2b are illustrated as pads crossing two adjacent device layers, but is not limited thereto. Portions of the pad 260 can be formed in one of the device layers but does not cross over a device layer adjacent thereto, as shown in FIG. 2c. Pads 250 and 260 illustrated in FIGS. 2a-2c can function as pad for signal input/output (I/O), power input, or heat dissipation of a device formed within the IC device 200, for example. Materials of the pads 250 and 260 can be, for example, aluminum, copper or alloys thereof.

As shown in FIGS. 2a-2c, integrated circuit devices having additional pads are provided. Compared with the conventional integrated circuit device, a great number of pads for I/O or pin connection can be obtained. In addition, some of the pads can function as a heat dissipation pad but not as I/O pad, thereby enhancing heat dissipation efficiency of the IC device.

Figure 3A:
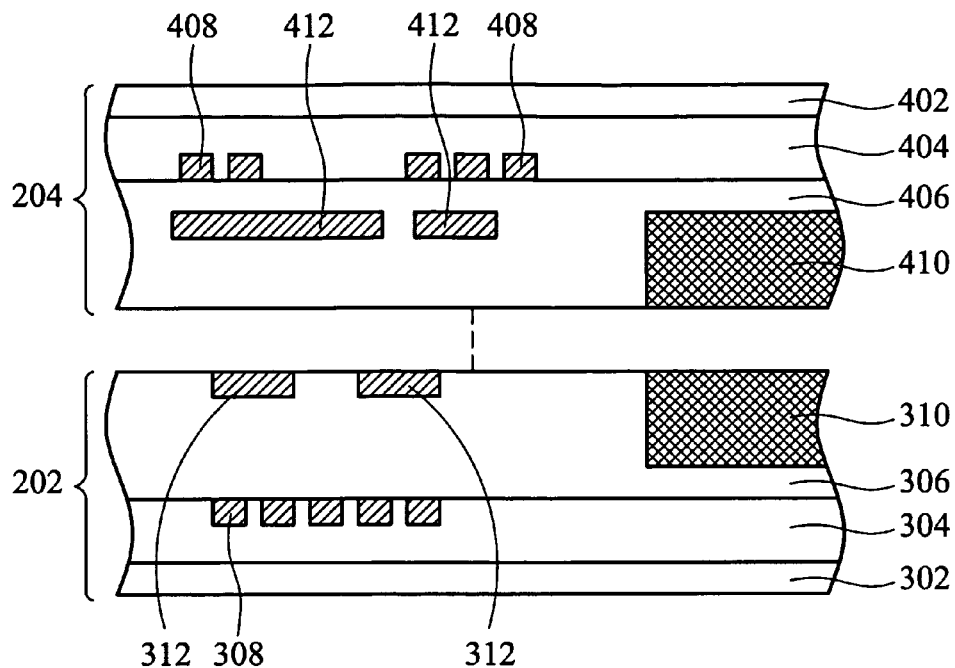
FIGS. 3a-3b are schematic diagrams of an embodiment of a method for fabricating a composite device layer having a pad exposed at an edge thereof.
Figure 3B:
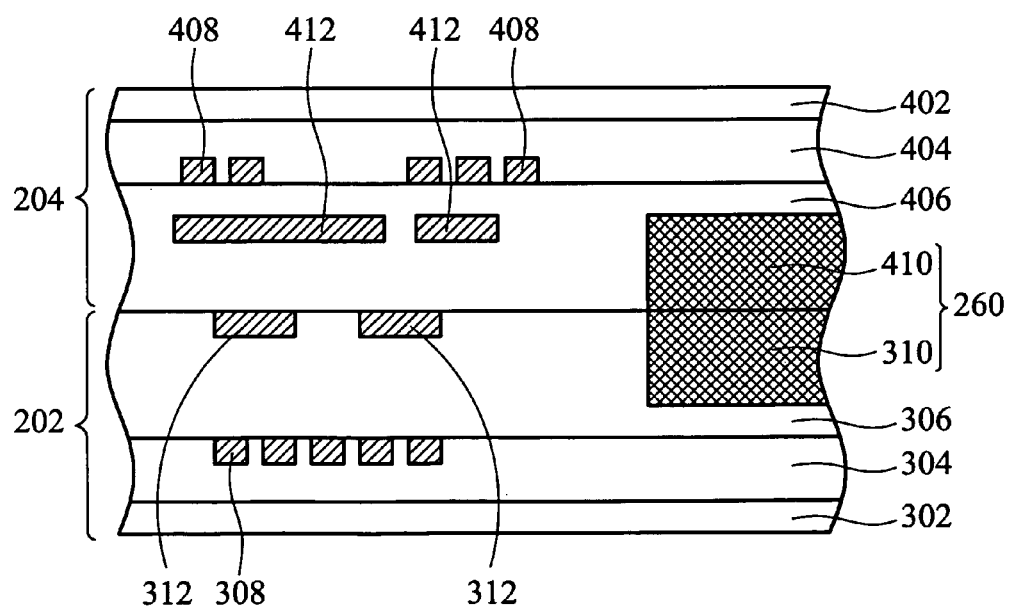

FIGS. 3a-3b are schematic diagrams showing a method for fabricating a composite device layer having a pad exposed at an edge surface thereof shown in FIGS. 2a-2c. Referring now to FIG. 3a, wafers 202 and 204 are first provided. The wafer 202 is composed of a plurality of layers 302, 304, 306, and 310 of dielectric and/or semiconductor materials. Devices or interconnects 308 and 312 can be formed in one or more of the layers 302, 304, 306, and 310 to form an integrated circuit of certain functionality and a pad 310 is formed in layer 306. The wafer 204 is composed of a plurality of layers 402, 404, 406, and 410 of dielectric and/or semiconductor materials. Devices or interconnections 408 and 412 can be formed in one or more of the layers 402, 404, 406, and 410 to form an integrated circuit structure for providing certain functionality and a pad 410 is formed in the layer 406. Pads 310 and 410 can be connected by an internal interconnect structure (not shown) to thereby provide a conductive path to a device formed in the wafer.

As shown in FIG. 3b, wafers 202 and 204 are next bonded together to form a composite wafer. Pads 310 and 410 of each of the wafers 202 and 204 are first aligned and then bonded to thereby form a composite pad 260. Next, a substrate portion of the wafers 202 and 204 are then thinned and the wafers 202 and 204 are sawed to form dies with the device layer including a composite pad 260 and thereby exposes the composite pad 260 by an edge thereof.

Figure 4A:
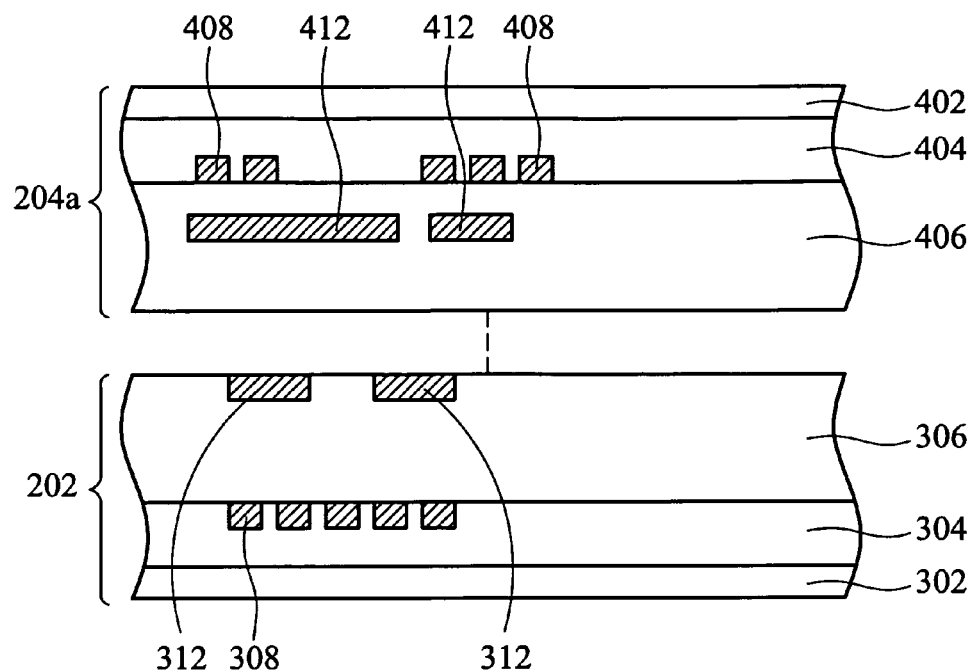
FIGS. 4a-4e are schematic diagrams of an embodiment of a method for fabricating a composite device layer having a pad exposed at an edge thereof.

FIGS. 4a-4e are schematic diagrams showing another method for fabricating a composite device layer having a pad exposed at an edge thereof. In FIG. 4a, wafers 202 and 204a are first provided. The wafer 202 is composed of a plurality of layers 302, 304, 306, and 310 of dielectric and/or semiconductor materials. Devices or interconnects 308 and 312 can be formed in one or more of the layers 302, 304, 306, and 310 to form an integrated circuit of certain functionality. The wafer 204a is composed of a plurality of layers 402, 404, 406, and 410 of dielectric and/or semiconductor materials. Devices or interconnections 408 and 412 can be formed in one or more of the layers 402, 404, 406, and 410 to form an integrated circuit of certain functionality. At this time, no pad is formed in the wafers 202 and 204a.

Figure 4B:
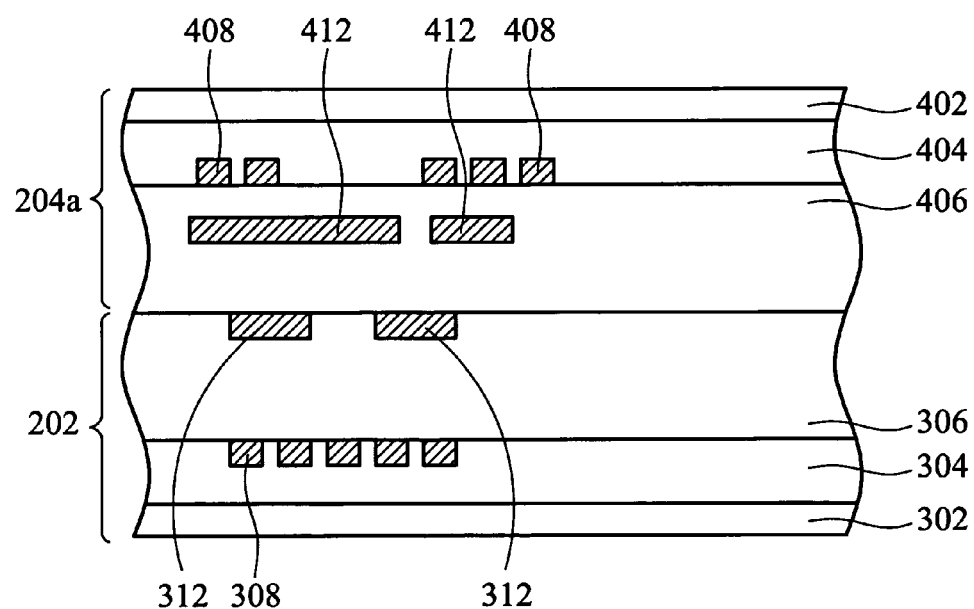
Figure 4C:
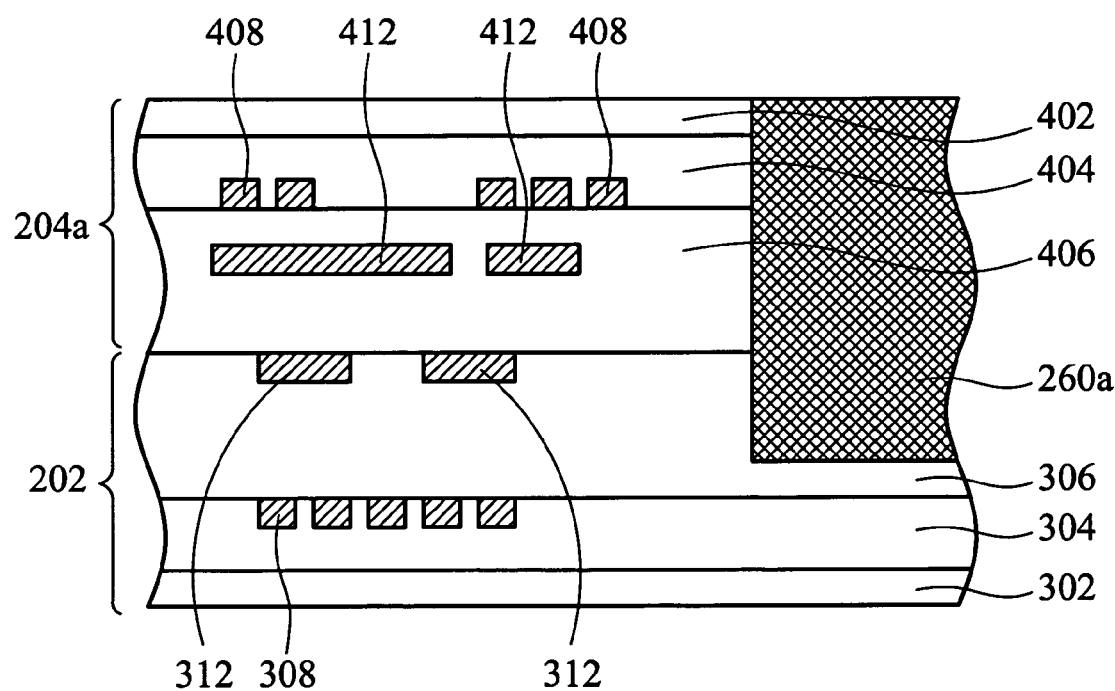
Figure 4D:
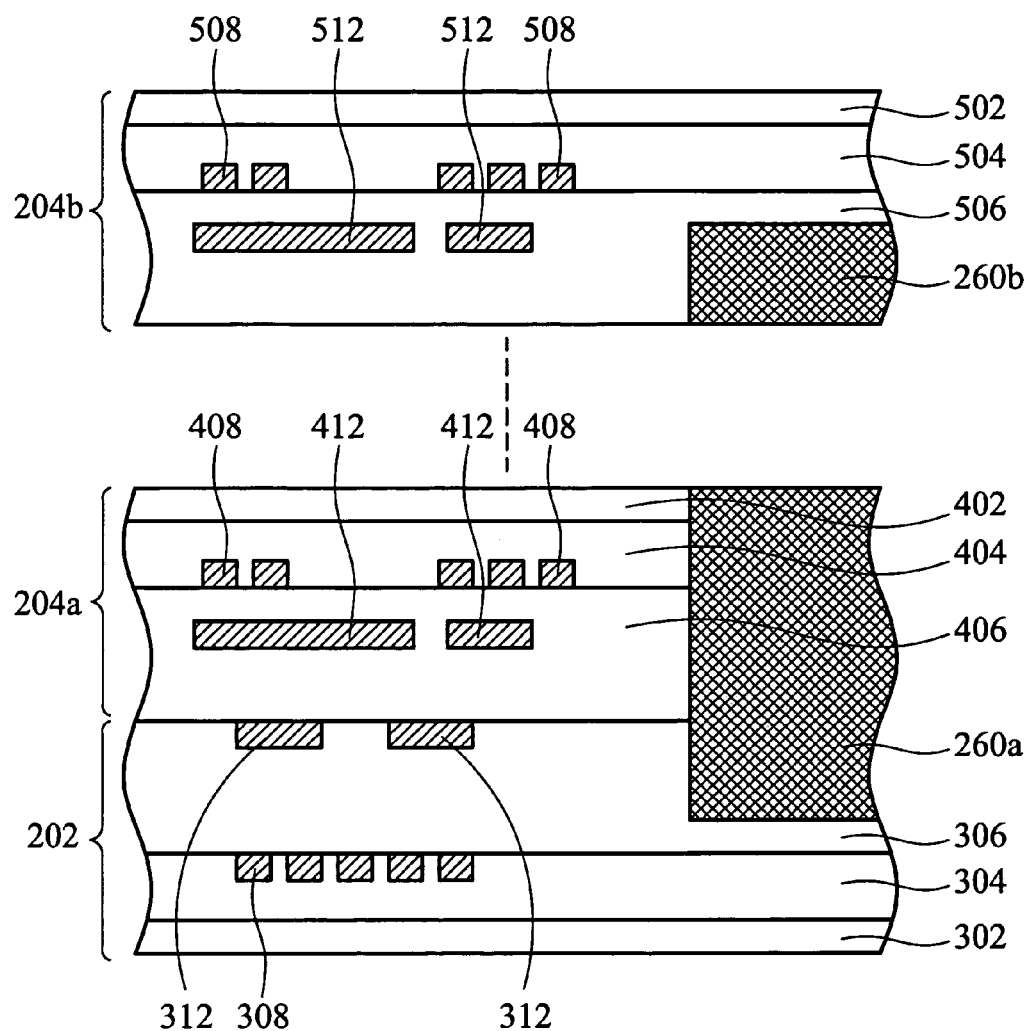
Figure 4E:
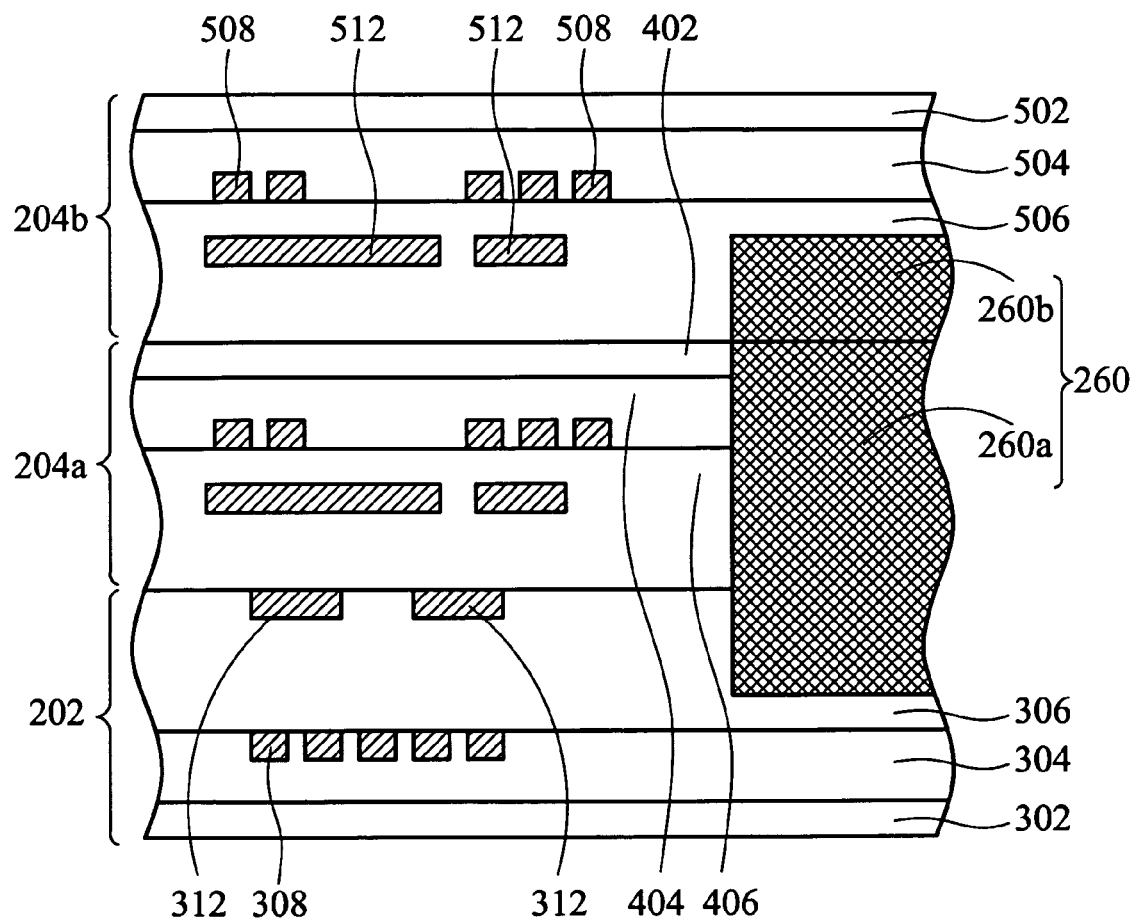

As shown in FIG. 4b, wafers 202 and 204a are next bonded together to form a composite wafer. Next, the composite wafer is processed to form a pad 206a therein, passing through the layers 402, 404, 406, 410 and 310, as shown in FIG. 4c. Next, a wafer 204b is provided. The wafer 204b is composed of a plurality of layers 502, 504, 506, and 510 of dielectric and/or semiconductor materials. Devices or interconnects 508 and 512 can be formed in one or more of the layers 502, 504, 506, and 510 to form an integrated circuit of certain functionality and a pad 260b is formed in the layer 506. As shown in FIG. 4e, the wafer 204b and the composite wafer including the wafers 202 and 204a are next bonded together to form a composite wafer. Pads 260b and 260a thereof are aligned and bonded to thereby form a composite pad 260. Next, the composite wafer comprising wafers 202 and 204a and 204b are sawed to form dies with such device layer including a composite pad 260 exposed thereby.

Further details of forming a three dimensional integrated circuits (3D ICs) can be found in US patent application publications 2004/0214387 (Madurawe) and 2005/003650 (Ramanahan et al.) and are incorporated herein by reference, wherein US patent application publications 2004/0214387 is related to methods for fabricating three dimensional integrated circuit and US patent application publications 2005/003650 is related to three-dimensional stacked substrate arrangements.

Figure 5A:
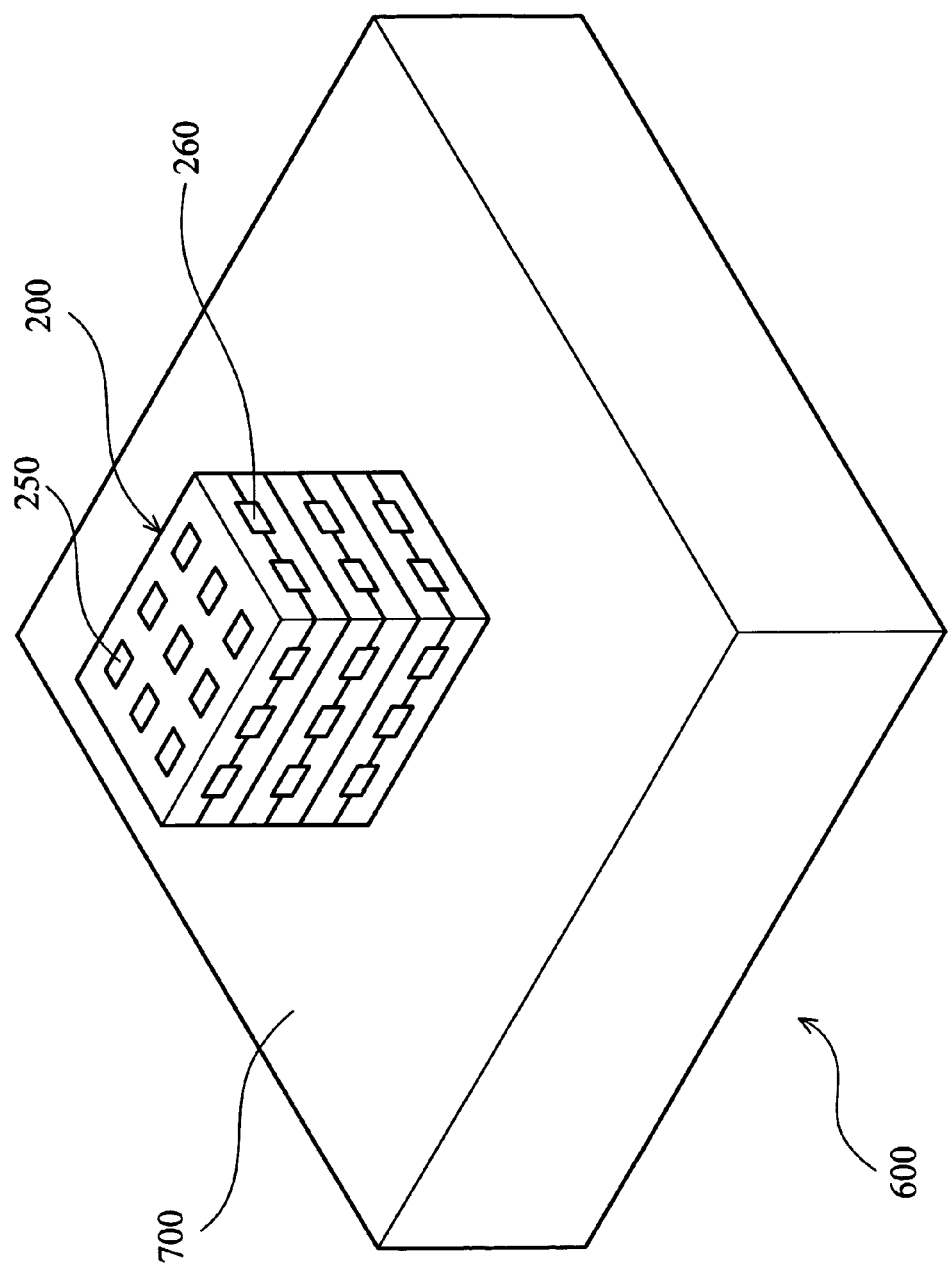
FIGS. 5a-5c are schematic diagrams showing various embodiments of an integrated circuit package.
Figure 5B:
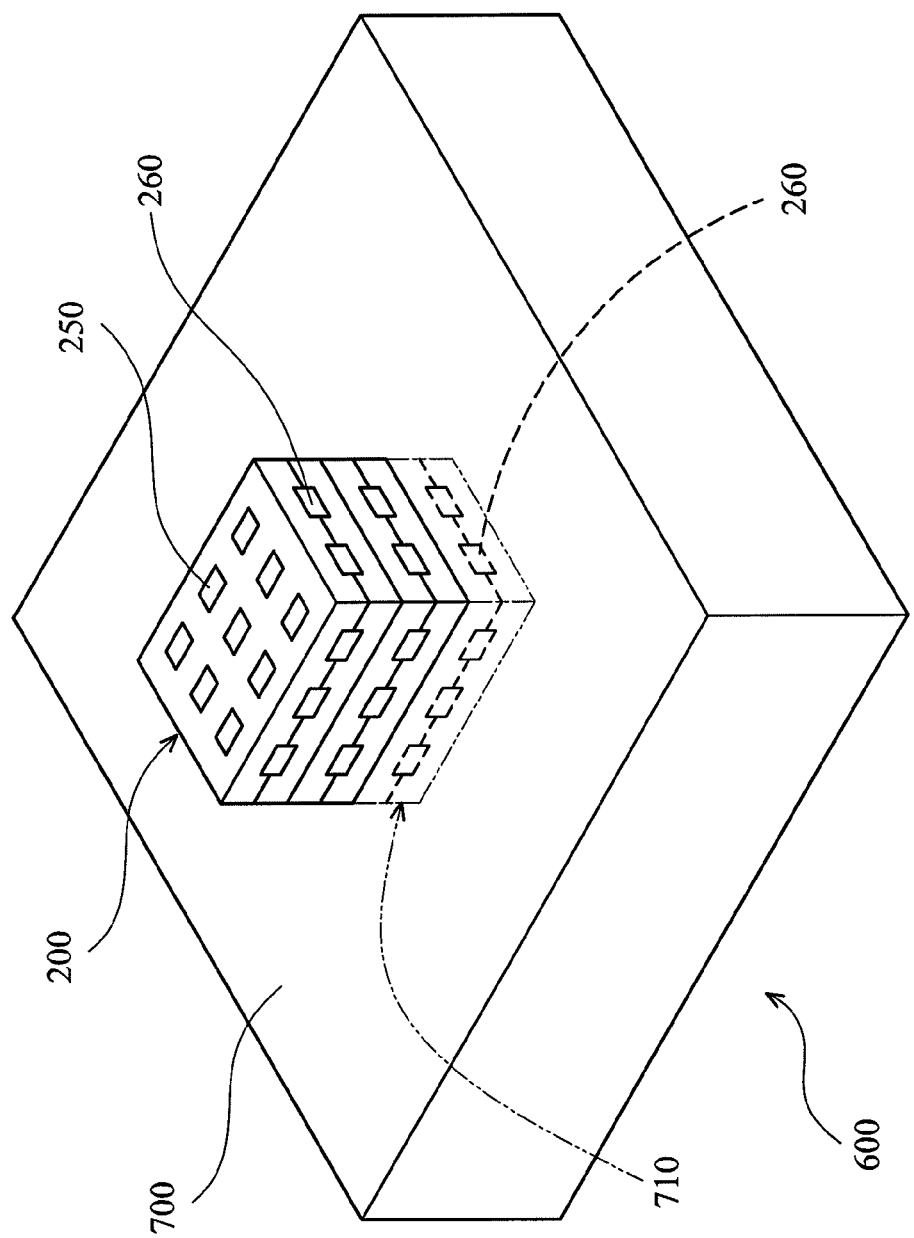
Figure 5C:
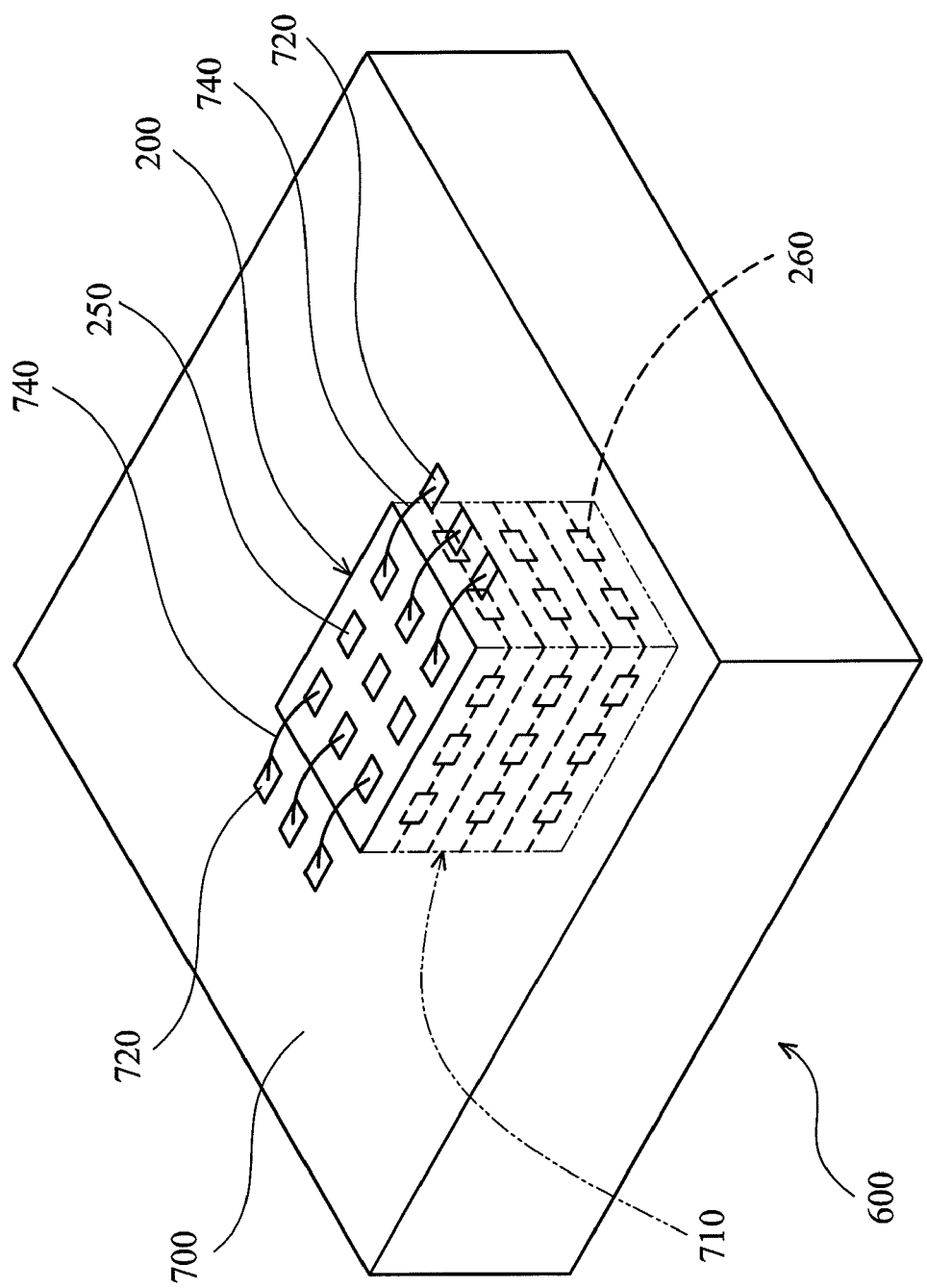

FIGS. 5a-5c are schematic diagrams of various embodiments of a package 600 including the IC device 200. As shown in FIG. 5a, the IC device 200 is now mounted on a substrate 700 and electrically connects the substrate 700 by conductive bonding such as bumps or conductive wires (both not shown). At this time, the conductive bonding may electrically connect pads (not shown) exposed by a bottom surface of a bottommost device layer.

The substrate 700 may further be formed with a recess 710 and the IC device 200 can be mounted on the substrate 700 and be partially embedded in the recess 710, as shown in FIG. 5b. At this time, electrical connections between the IC device 200 and the substrate 700 can be established by conductive bonding such as bumps or internal wiring (not shown) formed in the recess 710 and the substrate 700. The conductive bonding may electrically connect pads (not shown) exposed by a bottom surface of a bottommost device layer 202. and/or by portions of the pads 260 embedded in the recess 710 with an internal wiring (not shown) formed in the substrate 700.

As shown in FIG. 5c, the substrate 700 may be formed with a recess (715 and the IC device 200 can be mounted on the substrate 700 and be fully embedded in the recess. The substrate 700 may be substantially coplanar with the IC device 200. At this time, electrical connections between the IC device 200 and the substrate 700 can be established by pads (not shown) exposed by a bottom surface of a bottommost device layer 202 and/or by portion of the pads 260 embedded in the recess with conductive bonding such as internal wiring or bumps (both not shown) formed in the substrate 700. Moreover, the substrate 700 can be formed with a plurality of bond pads 720 thereon and the bond pads 720 can electrically connect the pads 250 exposed by a topmost surface of the IC device 200 by conductive bonding such as a conductive wire 740 here.

Figure 6A:
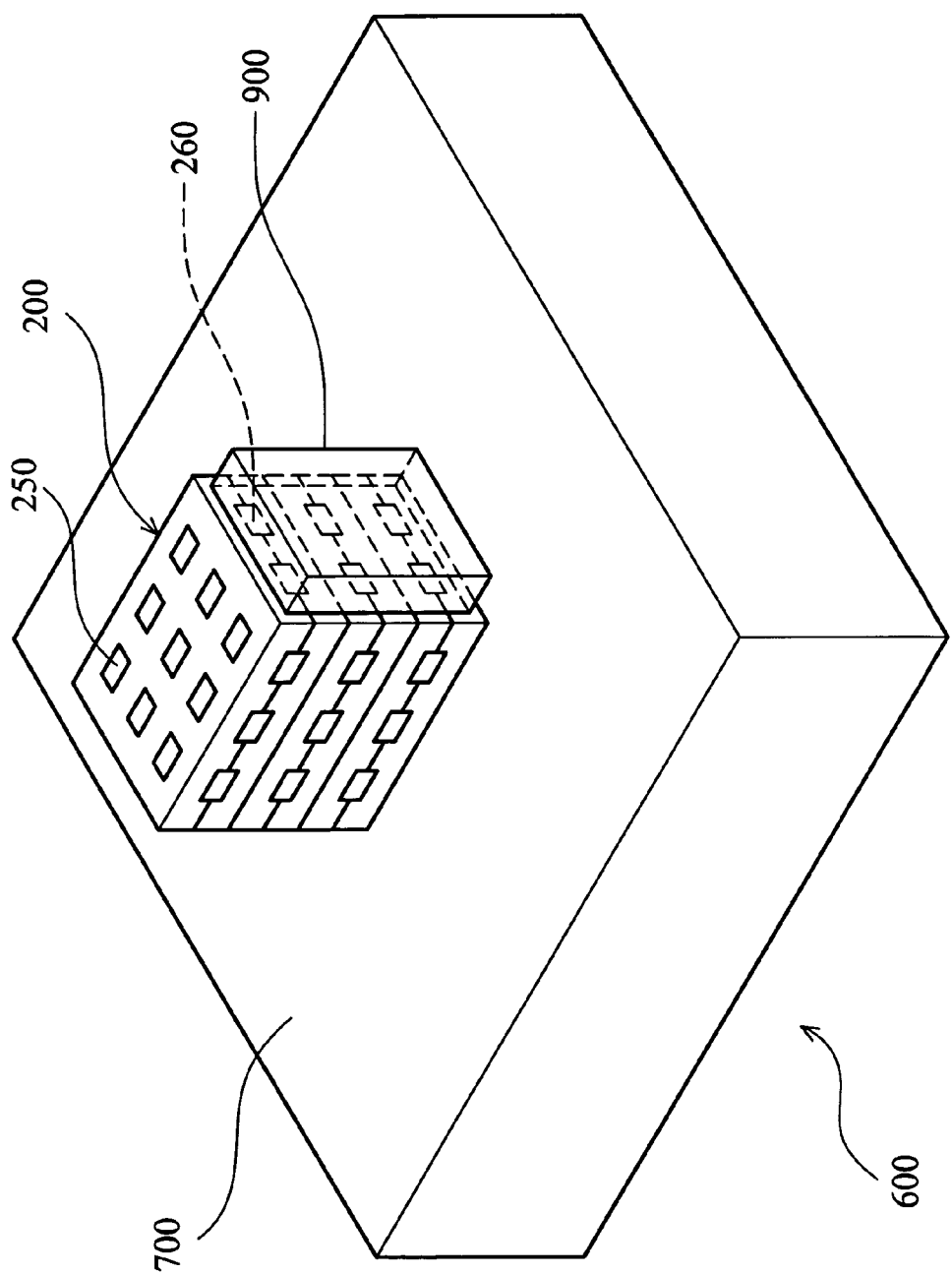
FIGS. 6a-6c are schematic diagrams showing various embodiments of an integrated circuit package, each having more than one substrate for device packaging.
Figure 6B:
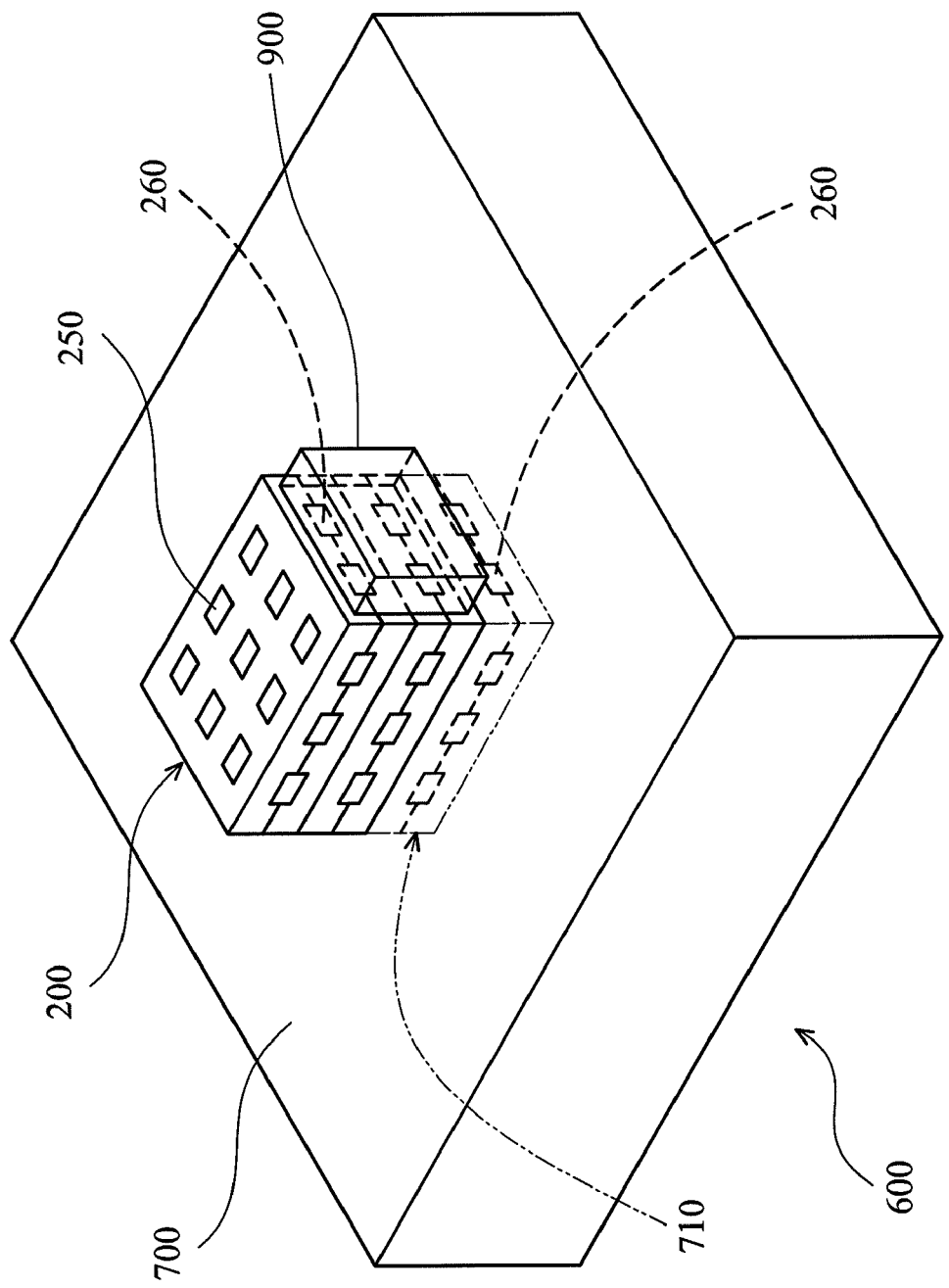
Figure 6C:
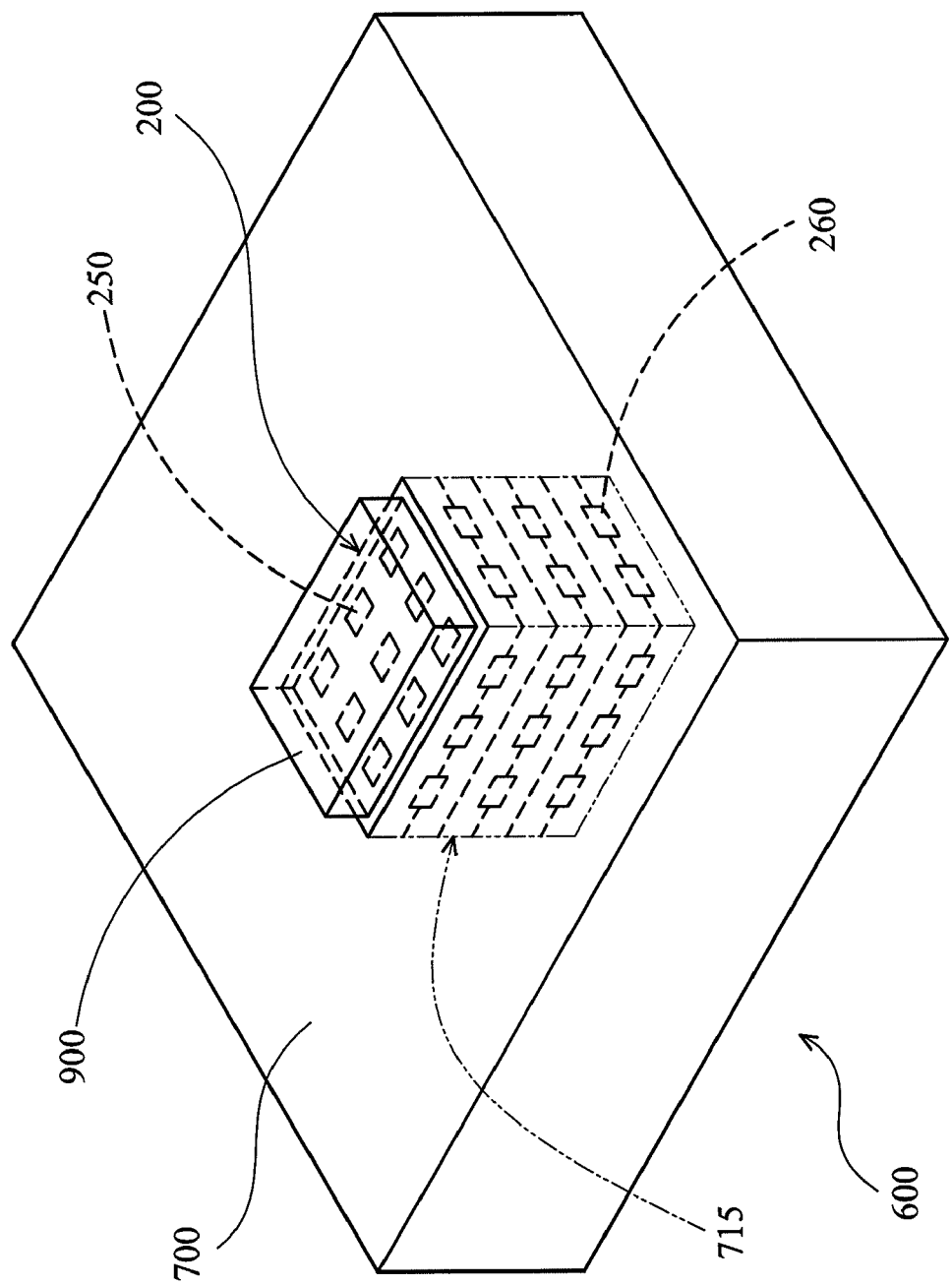

Moreover, an additional substrate for device packaging can be further provided and electrically bonded with the pads 260 formed on one or more surfaces of the IC device 200 not bonded with the substrate 700 of the package 600, thereby utilizing more pads formed thereon and providing additional functionality. FIGS. 6a-6c respectively illustrates the package 600 shown in each of the FIGS. 5a-5c provided with an additional substrate 900 for device packaging. In FIGS. 6a-6b, the substrate 900 is illustrated as a substrate electrically bonded with the pads 260 formed at a sidewall surface of the IC device 200 and is not limited thereto. Additional substrates 900 for device packaging can be further provided and bonded with the pads 250 or 260 exposed on other surfaces of the IC device 200 which is not bonded with the substrate 700 and 900 until all the pads of the IC device 200 are all utilized, but illustrations of such bonding are not further shown here, for simplicity. The number of the addition substrate 900 for addition device packaging can be up to five to the IC device 200 illustrated in FIGS. 5a-5b. In FIG. 6c, only one substrate 900 can be provided to the package 600 illustrated in FIG. 5c and the substrate 900 now covers a top surface of IC device 200, thereby electrically bonding the pads 250 formed thereon. At this time, formation of the conductive wire 270 and the pads 720 of the substrate 700 are optional and are not shown in FIG. 6c.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit package, comprising:
    a first package substrate;
    an integrated circuit (IC) stack structure formed over the first package substrate, comprising a plurality of device layers, wherein one of the device layers comprises opposing top and bottom surfaces, a plurality of sidewall surfaces surrounding the top and bottom surfaces, and a first pad exposed by one of the sidewall surfaces thereof, and wherein an underlying device layer of the device layers comprises a second pad exposed by a sidewall surface thereof, an overlying device layer of the device layers comprises a third pad exposed by a sidewall surface thereof, and the third pad substantially overlies the second pad to form a composite pad, and wherein the second pad physically contacts the underlying device layer of the device layers and the third pad physically contacts the overlying device layer of the device layers; and
    a second packaging substrate electrically bonded to the composite pad from a sidewall of the IC stack structure.

2. The integrated circuit package as claimed in claim 1, wherein the underlying device layer comprises a plurality of second pads exposed by at least one sidewall surface thereof, the overlying device layer comprises a plurality of third pads exposed by at least one sidewall surface thereof, and the third pads substantially overlie the second pads, respectively, to form a plurality of composite pads.

3. The integrated circuit package as claimed in claim 1, further comprising a fourth pad formed in a topmost device layer of the device layers and the fourth pad is exposed by a top surface thereof.

4. The integrated circuit package as claimed in claim 1, further comprising a fourth pad formed in a bottommost device layer of the device layers, wherein the IC package further comprises at least one second conductive bonding formed thereon, electrically connecting the fourth pad and the second conductive bonding.

5. An integrated circuit package, comprising:
    a first package substrate;
    an integrated circuit (IC) stack structure partially embedded in the first package substrate, comprising a plurality of device layers, wherein one of the device layers comprises opposing top and bottom surfaces, a plurality of sidewall surfaces surrounding the top and bottom surfaces, and a first pad exposed by one of the sidewall surfaces thereof, and wherein a underlying device layer of the device layers comprises a second pad exposed by a sidewall surface thereof, an overlying device layer of the device layers comprises a third pad exposed by a sidewall surface thereof, and the third pad substantially overlies the second pad to form a composite pad, and wherein the second pad physically contacts the underlying device layer of the device layers and the third pad physically contacts the overlying device layer of the device layers; and
    a second packaging substrate electrically bonded to the composite pad from a sidewall of the IC stack structure.

6. The integrated circuit package as claimed in claim 5, wherein the underlying device layer comprises a plurality of second pads exposed by at least one sidewall surface thereof, the overlying device layer comprises a plurality of third pads exposed by at least one sidewall surface thereof, and the third pads substantially overlie the second pads, respectively, to form a plurality of composite pads.

7. The integrated circuit package as claimed in claim 5, further comprising a fourth pad formed in a topmost device layer of the device layers and the fourth pad is exposed by a top surface thereof.

8. The integrated circuit package as claimed in claim 5, further comprising a fourth pad formed in a bottommost device layer of the device layers, wherein the IC package further comprises at least one second conductive bonding formed thereon, electrically connecting the fourth pad and the second conductive bonding.

9. An integrated circuit package, comprising:
    a first package substrate;
    an integrated circuit (IC) stack structure embedded in the first package substrate, comprising a plurality of device layers, wherein one of the device layers comprises opposing top and bottom surfaces, a plurality of sidewall surfaces surrounding the top and bottom surfaces, and a first pad exposed by the top surface thereof, and wherein the top surface of the IC stack structure is coplanar with a surface of the first package substrate where the bond pad is formed; and a second packaging substrate electrically bonded to the first pad from a top surface of the IC stack structure.

10. The integrated circuit package as claimed in claim 9, wherein a underlying device layer of the device layers comprises a second pad exposed by a sidewall surface thereof, an overlying device layer of the device layers comprises a third pad exposed by a sidewall surface thereof, the third pad substantially overlies the second pad to form a composite pad, a topmost device layer of the IC stack structure comprises a fourth pad exposed by an top surface thereof and the integrated circuit (IC) stack is substantially coplanar with the first package substrate.

11. The integrated circuit package as claimed in claim 10, wherein the underlying device layer comprises a plurality of the second pads exposed by at least one sidewall surface thereof, the overlying device layer comprises a plurality of the third pads exposed by at least one sidewall surface thereof, wherein the third pads substantially overlie the second pads, respectively, to form a plurality of the composite pads.

12. The integrated circuit package as claimed in claim 11, the first package substrate further comprising at least one internal wiring embedded therein, electrically connecting the composite pad.

* * * * *